US 6,597,220 B2

(12) United States Patent
Mizuno et al.

(10) Patent No.: US 6,597,220 B2
(45) Date of Patent: Jul. 22, 2003

(54) SEMICONDUCTOR INTEGRATED CIRCUIT DEVICE AND MICROCOMPUTER

(75) Inventors: Hiroyuki Mizuno, Kokubunji (JP); Takahiro Nagano, Higashi-Murayama (JP); Yoshinobu Nakagome, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/241,505

(22) Filed: Sep. 12, 2002

(65) Prior Publication Data

US 2003/0006816 A1 Jan. 9, 2003

Related U.S. Application Data

(60) Continuation of application No. 09/994,645, filed on Nov. 28, 2001, which is a continuation of application No. 09/688,234, filed on Oct. 16, 2000, now Pat. No. 6,388,483, which is a continuation of application No. 09/415,220, filed on Oct. 12, 1999, now Pat. No. 6,166,577, which is a division of application No. 08/622,389, filed on Mar. 27, 1996.

(30) Foreign Application Priority Data

Mar. 29, 1995 (JP) ............................................. 7-071136

(51) Int. Cl.⁷ ................................................ H03L 7/06
(52) U.S. Cl. ........................ 327/158; 327/159; 327/277
(58) Field of Search ................................ 327/155, 158, 327/159, 276, 277, 278, 233, 234, 237

(56) References Cited

U.S. PATENT DOCUMENTS

| | | | |
|---|---|---|---|
| 4,899,071 A | 2/1990 | Morales | 327/277 |
| 4,922,141 A | 5/1990 | Lofgren et al. | 327/276 |
| 5,039,893 A | 8/1991 | Tomisawa | 327/276 |
| 5,146,121 A | 9/1992 | Searles et al. | 327/276 |
| 5,184,027 A | 2/1993 | Masuda et al. | 327/149 |
| 5,216,302 A | 6/1993 | Tanizawa | 327/157 |
| 5,231,319 A | 7/1993 | Crafts et al. | 327/277 |
| 5,252,867 A | 10/1993 | Sorrells et al. | 327/152 |
| 5,420,531 A | 5/1995 | Wetlaufer | 327/270 |
| 5,420,544 A | 5/1995 | Ishibashi | 327/156 |
| 5,461,338 A | 10/1995 | Hirayama et al. | 327/534 |
| 5,475,344 A | 12/1995 | Maneatis et al. | 327/158 |
| 5,568,072 A | 10/1996 | Schoellkopf | 327/153 |
| 5,703,522 A | 12/1997 | Arimoto et al. | 327/534 |
| 6,081,146 A | * 6/2000 | Shiochi et al. | 327/277 |

FOREIGN PATENT DOCUMENTS

| | | |
|---|---|---|
| JP | 62-272619 | 11/1987 |
| JP | 63-69315 | 3/1988 |
| JP | 4-247653 | 9/1992 |
| JP | 5-152935 | 6/1993 |
| JP | 5-235714 | 9/1993 |

OTHER PUBLICATIONS

1993 Symposium on VLSI Circuits Digest of Technical Papers, May 1993, pp. 45–46.
1994 Symposium on VLSI Technology Digest of Technical Papers, Jun. 1994, pp. 13–14.
IEEE Journal of Solid-State Circuits, vol. 22, No. 2, Apr. 1987, pp. 255–261.
ISSCC Digest of Technical Papers, Feb. 1989, pp. 248–249.
1992 IEDM Technical Digest, pp. 35–38.

* cited by examiner

Primary Examiner—Terry D. Cunningham
(74) Attorney, Agent, or Firm—Mattingly, Stanger & Malur, P.C.

(57) ABSTRACT

A semiconductor integrated circuit includes a logic circuit which is formed of p-channel MIS transistors and n-channel MIS transistors, a first oscillation circuit of variable oscillation frequency which is formed of p-channel MIS transistors and n-channel MIS transistors, a control circuit which produces a control signal for controlling the threshold voltage of the p-channel and n-channel MIS transistors, and a second oscillation circuit which produces multiple reference clock signals of different frequencies depending on the operation mode. The control circuit receives a reference clock signal and controls first oscillation circuit with the control signal so that the oscillation frequency of the first oscillation circuit corresponds to the frequency of the reference clock signal.

4 Claims, 15 Drawing Sheets

SEMICONDUCTOR INTEGRATED CIRCUIT DEVICE AND MICROCOMPUTER

This is a continuation application of Ser. No. 09/994,645, filed Nov. 28, 2001; which is a continuation application of Ser. No. 09/688,234, filed Oct. 16, 2000, now U.S. Pat. No. 6,388,483; which is a continuation application of Ser. No. 09/415,220, filed Oct. 12, 1999, now U.S. Pat. No. 6,166,577; which is a divisional application of U.S. Ser. No. 08/622,389, filed Mar. 27, 1996.

BACKGROUND OF THE INVENTION

The present invention relates to a semiconductor integrated circuit, and particularly to a semiconductor integrated circuit device and microcomputer that are intended for fast and low-voltage operation, and to a microcomputer system based on this microcomputer.

In order for a MOS transistor to operate at a low voltage around 1 V, it must have a lower threshold voltage for the enhancement of driving ability and operation speed. However, when the threshold voltage is set too low, the MOS transistor cannot turn off completely due to its subthreshold characteristics (tailing characteristics), causing a subthreshold leakage current to flow, resulting in an increased power consumption, as described in publication "1993 Symposium on VLSI Circuits Digest of Technical Papers", pp. 45–46 (May 1993).

As the sub-micron MOS transistor pattern design advances, the variation among devices of the fundamental characteristics including the threshold voltage attributable to the unequality of manufacturing process increases, as described in publication "1994 Symposium on VLSI Circuits Digest of Technical Papers", pp. 13–14 (June 1994).

FIG. 15 shows the variation of threshold voltage in connection with the gate length Lg of a MOS transistor. The variation of threshold voltage due to the gate length variation increases as the gate length Lg becomes shorter.

Assuming the lower limit of threshold voltage to be 0.2 V for making the subthreshold leakage current below a certain value and the above-mentioned process-causing threshold variation to be ±0.15 V, the actual lower limit of threshold voltage as the sum of these values becomes 0.35 V.

On this account, conventional semiconductor integrated circuit devices cannot have their threshold voltage set much lower. Particularly, MOS transistors with lower power voltages operate in a state of incomplete saturation, and the operation speed of MOS transistor circuits falls sharply in response to a slight rise of the threshold voltage. Therefore, it is difficult for the conventional design methodology based on the worst-case consideration to attain the intended performance of semiconductor integrated circuit devices.

SUMMARY OF THE INVENTION

The present invention is intended to overcome the foregoing prior art deficiency.

An object of the invention is to provide a semiconductor integrated circuit device formed of MOS transistors capable of properly arbitrating the conflicting factors of the increased power consumption caused by the subthreshold leakage current and the higher operation speed of MOS transistors.

Another object of the invention is to provide a semiconductor integrated circuit device capable of controlling the threshold voltage properly so that the power consumption and the operation speed are well balanced.

Still another object of the invention is to provide a semiconductor integrated circuit device capable of controlling the threshold voltage easily based on the external clock frequency.

Still another object of the invention is to provide a semiconductor integrated circuit device which is operative at multiple clock frequencies and capable of controlling the threshold voltage in correspondence to a selected clock frequency.

Still another object of the invention is to provide a semiconductor integrated circuit device capable of controlling the threshold voltage optimally for each MOS transistor even in case it is unequal among individual transistors.

Still another object of the invention is to provide a microcomputer which is controlled to operate at an optimally balanced power consumption and operation speed, and a microcomputer system based on the microcomputer.

In order to achieve the above objectives, the inventive semiconductor integrated circuit device comprises MOS transistors that constitute a main circuit and "delay-monitoring" MOS transistors that are provided in correspondence to the main-circuit MOS transistors, with these MOS transistors being operated under the corresponding substrate biases.

The operation speed or delay characteristics of the circuit is detected based on the comparison of a signal produced by the delay-monitoring MOS transistors with a clock signal or other reference timing signal. The substrate bias level is controlled in response to the result of detection so that the main-circuit MOS transistors have an appropriate threshold voltage. The substrate bias level control is a sort of monitor control based on the delay-characteristics detecting transistors and the reference signal.

The difference of the delay characteristics of the circuit from the reference can be detected from a frequency error or phase error of the signal produced by the delay-monitoring MOS transistors with respect to the reference signal.

As a preferable arrangement, an oscillation circuit is designed such that the delay-monitoring MOS transistors determine the output frequency of the oscillation circuit. In this case, the delay characteristics is detected based on frequency error information that takes a continuous signal form derived from the oscillation signal.

According to a preferred embodiment of this invention, a main circuit that is a logic circuit is connected with a substrate-bias dependent oscillation circuit which shares the substrate bias with the main circuit and an operation-mode dependent oscillation circuit which switches the output frequency depending on the operation mode, and a substrate bias control circuit controls the substrate bias of the main circuit by making both oscillation outputs synchronous.

A semiconductor integrated circuit device according to a preferred embodiment of this invention comprises a logic circuit which implements a certain logical operation, a control circuit which controls the threshold voltage of transistors that form the logic circuit, and a variable-frequency oscillation circuit, wherein the logic circuit includes MOS transistors formed on a semiconductor substrate, the oscillation circuit has its output delivered to the control circuit which also receives a reference clock of a certain frequency and adapted to produce a first control signal for controlling the oscillation circuit so that the oscillation output has a frequency correspondent to the frequency of the reference clock, and the MOS transistors of the logic circuit have their threshold voltage controlled by a second control signal that corresponds to the first control signal.

A semiconductor integrated circuit device according to a preferred embodiment of this invention comprises a logic circuit including MIS transistors formed on a semiconductor substrate, a control circuit which controls the threshold voltage of the MIS transistors of the logic circuit, and an oscillation circuit including MIS transistors formed on the semiconductor substrate and adapted to vary the output frequency, wherein the control circuit receives the output signal of the oscillation circuit and a clock signal of a certain frequency and compares the oscillation output frequency with the clock signal frequency to produce a first control signal, the oscillation circuit has its threshold voltage controlled by the first control signal so that the oscillation output has a frequency correspondent to the clock signal frequency, and the MIS transistors of the logic circuit have their threshold voltage controlled by a second control signal that corresponds to the first control signal.

A semiconductor integrated circuit device according to a preferred embodiment of this invention comprises a logic circuit including p-channel MIS transistors and n-channel MIS transistors, a first oscillation circuit of variable frequency including p-channel MIS transistors and n-channel MIS transistors, a control circuit which produces a control signal for controlling the threshold voltages of these p-channel MIS transistors and n-channel MIS transistors, and a second oscillation circuit which produces reference clocks of different frequencies depending on the operation mode, wherein the control circuit receives one of the reference clocks and controls the first oscillation circuit so that the oscillation output has a frequency that corresponds to the frequency of the reference clock.

A semiconductor integrated circuit device according to a preferred embodiment of this invention comprises a logic circuit having at least a first and second circuit blocks, a first and second oscillation circuits of variable frequencies, a first control circuit which controls the threshold voltage of MIS transistors of the first circuit block and first oscillation circuit, a second control circuit which controls the threshold voltage of MIS transistors of the second circuit block and second oscillation circuit, a clock supply circuit which supplies a clock signal of a certain frequency to the first and second control circuits, wherein the first control circuit controls the threshold voltage of the MIS transistors of the first circuit block and first oscillation circuit so that the oscillation output frequency is equal to the frequency of the clock signal and the second control circuit controls the threshold voltage of the MIS transistors of the second circuit block and second oscillation circuit so that the oscillation output frequency is equal to the frequency of the clock signal.

A microcomputer according to a preferred embodiment of this invention comprises a load monitoring means for detecting the volume of processing (load) of the logic circuit formed of the above-mentioned semiconductor integrated circuit device, wherein the load monitoring means operates to vary the frequency of the clock signal depending on the detected volume of processing.

According to the preferred embodiments of this invention, the substrate-bias dependent oscillation circuit provided in the circuit device operates at a known frequency selected for the operation mode of the logic circuit as the main circuit, whereby the threshold voltage of MOS transistors of the oscillation circuit can be controlled optimally depending on the operation mode.

Because of the substrate bias of the substrate-bias dependent oscillation circuit common to that of the main circuit, the threshold voltage of MOS transistors used in the main circuit can be controlled optimally in each operation mode. Consequently, it becomes possible to minimize the power consumption caused by the subthreshold leakage current. The oscillation circuit operates in synchronism with a known frequency selected for each operation mode, allowing easy estimation of the delay of MOS transistors used in the main circuit and facilitating the main circuit design.

According to the preferred embodiments of this invention, the threshold voltage of transistors can be controlled by a simple circuit arrangement based on the reference clock, whereby the high operation speed and the smaller power consumption can be balanced.

According to the preferred embodiments of this invention, the oscillation circuit has its output frequency controlled to the reference clock frequency based on the threshold voltage control, whereby the logic circuit of the semiconductor integrated circuit device can be controlled efficiently.

According to the preferred embodiments of this invention, the logic circuit of the circuit device has its threshold voltage varied to meet each operation mode, whereby it has an optimal operation speed depending on the operation mode.

According to the preferred embodiment of this invention, the logic circuit is controlled by being divided into multiple blocks, whereby the threshold voltage control can be implemented, with the unequality of characteristics among transistors attributable to the manufacturing process being compensated.

According to the preferred embodiment of this invention, it is possible to build a microcomputer in which the internal logic circuit has its operation speed controlled through the monitoring of the volume of processing.

DESCRIPTION OF THE PREFERRED EMBODIMENTS

The embodiments this invention will be explained in detail with reference to the drawings.

Figure 1:
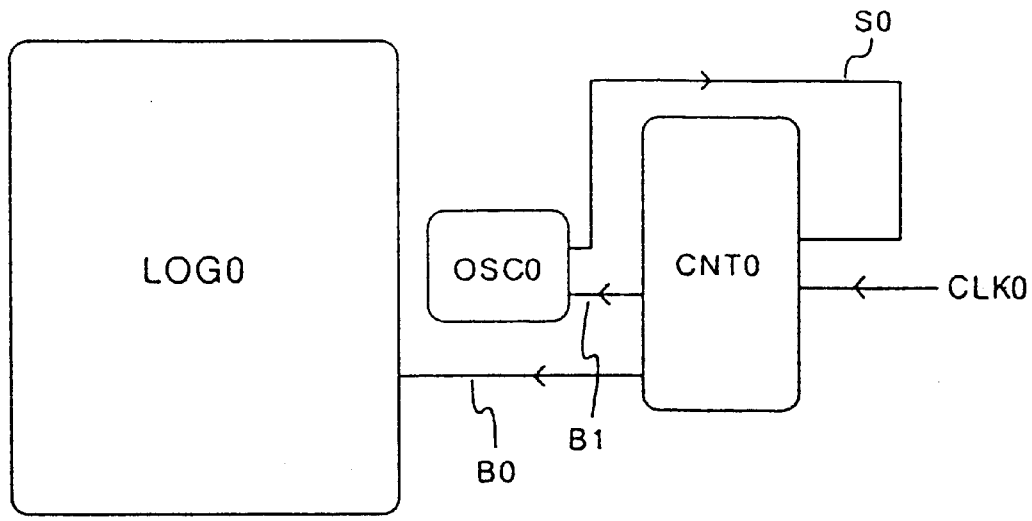
FIG. 1 is a block diagram of the semiconductor integrated circuit based on an embodiment of this invention.

FIG. 1 shows the first embodiment of this invention, in which the semiconductor integrated circuit device includes a main circuit LOG0 such as a logic circuit, a variable-frequency oscillation circuit OSC0, and a control circuit CNT0.

The oscillation circuit OSC0 receives a control signal B1 from the control circuit CNT0 and has its oscillation frequency dependent on the value of the control signal B1. The control circuit CNT0 receives an external clock signal CLK0 and the oscillation output S0 of the oscillation circuit OSC0, and produces control signals B0 and B1 that are proportional to the difference of frequency between the external clock signal CLK0 and oscillation output S0. The control signal B0 is fed to the main circuit LOG0, while the control signal B1 is fed to the oscillation circuit OSC0.

The control circuit CNT0 and variable-frequency oscillation circuit OSC0 in unison form a stable negative feedback system so that the frequency of the oscillation output S0 of the oscillation circuit OSC0 is correspondent to the frequency of the external clock signal CLK0. For example, these frequencies are equal, and the frequency of S0 is locked to the frequency of CLK0, as will be explained in more detail later.

The oscillation circuit OSC0 is formed of n-channel MOSFETs and p-channel MOSFEs formed on a semiconductor substrate, with the substrate bias being varied by the control voltage provided by the control circuit CNT0. The variation of the substrate bias varies the threshold voltage, and thus varies the oscillation frequency.

The main circuit LOG0 receives the control signal B0 from the control circuit CNT0, and its MOSFETs have their substrate bias and thus their threshold voltage controlled by the signal B0. This circuit arrangement enables to control the threshold voltage of the main circuit and accordingly vary its power consumption and operation speed in response to the external clock frequency.

More specifically, the oscillation circuit OSC0 receives the control signal B1 from the control circuit CNT0 and oscillates at a certain frequency. The oscillation circuit OSC0 is controlled by the control signal B1 so that the frequency of oscillation output S0 corresponds to the frequency of external clock signal CLK0. The control signal B1 controls the substrate bias of MOS transistors of the oscillation circuit OSC0 thereby to control their threshold voltage, and the MOS transistors operate at such an operation speed as to oscillate at the frequency that corresponds to the frequency of external clock signal CLK0.

Accordingly, by controlling the substrate bias of the main circuit LOG0 with the signal B0 which corresponds to the control signal B1 for the substrate bias of the oscillation circuit OSC0, it is possible to control the threshold voltage of the MOS transistors of the main circuit LOG0 so that it operates at the operation speed which corresponds to the external clock signal CLK0.

The control circuit CNT0 consists of a frequency/phase comparator (not shown in detail) which detects the difference of frequency between the external clock signal CLK0 and the oscillation output S0, and a control signal generation circuit which produces in response to the output of the frequency/phase comparator a control signal B0 to be fed to the main circuit LOG0 and a control signal B1 to be fed to the gates of MOSFETs of the oscillation circuit OSC0. The frequency/phase comparator, which has a delay detecting function or operation speed detecting function, delivers frequency error information in terms of the delay or operation speed of the main circuit LOG0 and oscillation circuit OSC0. In this invention, the frequency and phase have the same significance in representing the delay or operation speed, although these items should be treated separately in concept since phase control accompanies frequency control as will be appreciated in the following explanation.

The control signals B0 and B1 have certain reference levels when the oscillation output S0 corresponds in frequency to the external clock signal CLK0, or vary to increase the substrate bias level if the frequency of S0 is higher than CLK0 or decrease the substrate bias level if the frequency of SO is lower than CLK0.

It is known that a larger substrate bias raises the threshold voltage level of the related MOSFETs and a smaller substrate bias lowers their threshold voltage level. Accordingly, if the control signal B1 increases the substrate bias, the MOSFETs of oscillation circuit OSC0 have their conductance decreased accordingly, causing the time constant of OSC0, which is determined from the MOSFETs and parasitic capacitance, to increase, resulting in a lower oscillation frequency. Whereas, a decreased substrate bias causes the threshold voltage of MOSFETs to fall and their conductance to increase, resulting in a higher oscillation frequency of the oscillation circuit OSC0. In this manner, the oscillation frequency is controlled through the control of threshold voltage of MOSFETs.

In the embodiment of FIG. 1, the control signal generation circuit is designed to produce two control signals B0 and B1, which facilitates the circuit design and the achievement of intended response characteristics. In case the main circuit LOG0 and oscillation circuit OSC0 need to be supplied with control signals for their individual substrate biasing or in case it is intended to reduce the electrical coupling between the main circuit LOG0 and oscillation circuit OSC0 through their substrate, the control signal generation circuit may be two separate circuits for producing the control signals B0 and B1. In this case, the two control signal generation circuits receive the output of the frequency/phase comparator to produce the control signals B0 and B1 having an equal signal level. The two control signal generation circuits may have different circuit arrangements.

For example, in case the main circuit LOG0 has two states of active mode and sleep mode, the control signal B0 at sleep mode specifies a higher substrate bias in response to a certain sleep-mode command signal irrespective of the detected level of the frequency/phase comparator. With the control signal B1 being made responsive to the output of the frequency/phase comparator, the oscillation circuit OSC0 is controlled by the signal. Consequently, the power consumption can be reduced during sleep mode of the main circuit LOG0, and the control signal B0 to the main circuit LOG0 can be restored quickly when the circuit LOG0 has regained active mode.

Generally, when a high oscillation frequency is selected for the high-speed operation by setting a lower threshold voltage, the power consumption increases due to the sub-threshold leakage current, whereas when a lower oscillation frequency is selected by setting a higher threshold voltage, the power consumption decreases in exchange for a lower operation speed. When the main circuit LOG0 is a logic circuit that bases the operation on an external clock signal CLK0, the circuit operates at the speed corresponding to the external clock CLK0 through the control of the threshold voltage of MOS transistors of the main circuit LOG0. The threshold voltage is controlled so that the power consumption is smaller when the operation speed is lower.

Although in this embodiment the frequency of oscillation output S0 is controlled through the control of substrate bias of the oscillation circuit OSC0, another control scheme may be adopted by making the operation speed of MOS transistors variable in correspondence to the frequency of external clock signal CLK0. In this case, the oscillation circuit OSC0 functions as a means of monitoring the threshold voltage of the main circuit LOG0 for achieving the operation speed that corresponds to the frequency of external clock signal CLK0, and therefore it is necessary to convert the signal B1 for controlling the oscillation frequency of oscillation circuit OSC0 into the signal B0 for controlling the threshold voltage of the main circuit LOG0.

Although the foregoing embodiment is designed to vary the substrate bias in order to control the threshold voltage of transistors used in the main circuit LOG0, the transistor threshold voltage may be controlled in a different manner instead of the substrate bias control.

In contrast to the conventional variable-frequency oscillation circuit, in which in general the operation speed of the inverter circuit which constitutes a ring oscillator is made variable through the additional provision of transistors for controlling the supply current to the inverter circuit, the circuit arrangement for varying the oscillation frequency through the variation of substrate bias as in this embodiment eliminates the need of these current control transistors and supplies the power voltage to the inverter circuit without a loss, raises the upper limit of oscillation frequency, and expands the range of variable frequency.

The circuit arrangement of this embodiment also enables the oscillation frequency of the oscillation circuit to be locked to the frequency of an external clock signal, whereby it becomes possible to build a phase-locked loop (PLL) circuit which can follow a high-frequency external clock signal.

Figure 2:
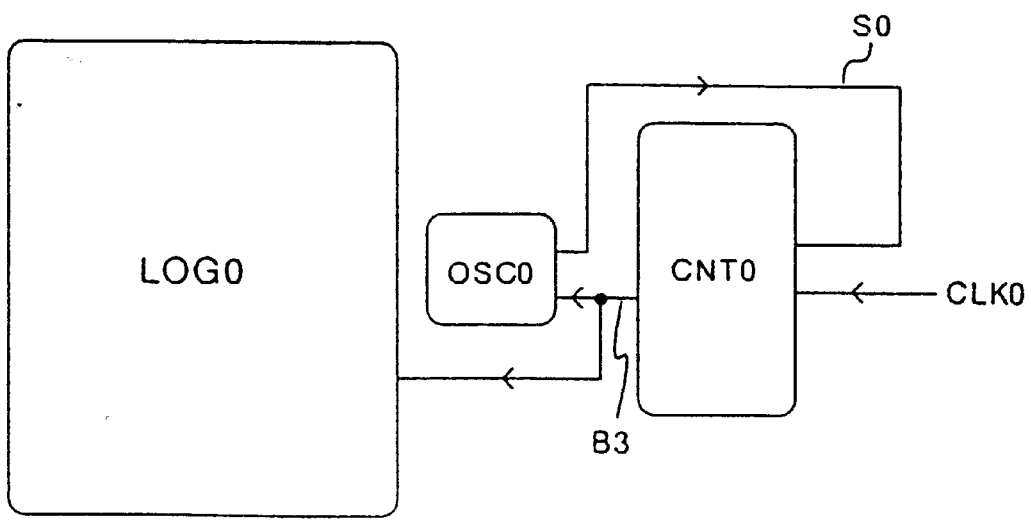
FIG. 2 is a block diagram of the semiconductor integrated circuit based on another embodiment of this invention.

FIG. 2 shows another embodiment of this invention. The principal portion of this embodiment is identical to the first embodiment, and detailed explanation thereof is omitted. This embodiment differs from the first embodiment shown in FIG. 1 in the use of a common control signal B3 in place of the control signals B0 and B1 for controlling the threshold voltage and oscillation frequency. Accordingly, the oscillation frequency of the oscillation circuit OSC0 is controlled through the variation of the substrate bias by the control signal B3 provided by the control circuit CNT0, and the substrate bias of the main circuit LOG0 is also controlled by the same control signal B3.

This embodiment using the common control signal B3 of the control circuit CNT0 simplifies the circuit arrangement and yet accomplishes the same effectiveness as the first embodiment. The embodiment enables to build an oscillation circuit having a wide range of frequency and a PLL circuit which can follow a high-frequency external clock signal. It also enables to control the operation speed and power consumption of the main circuit in response to the external clock frequency.

Figure 3:
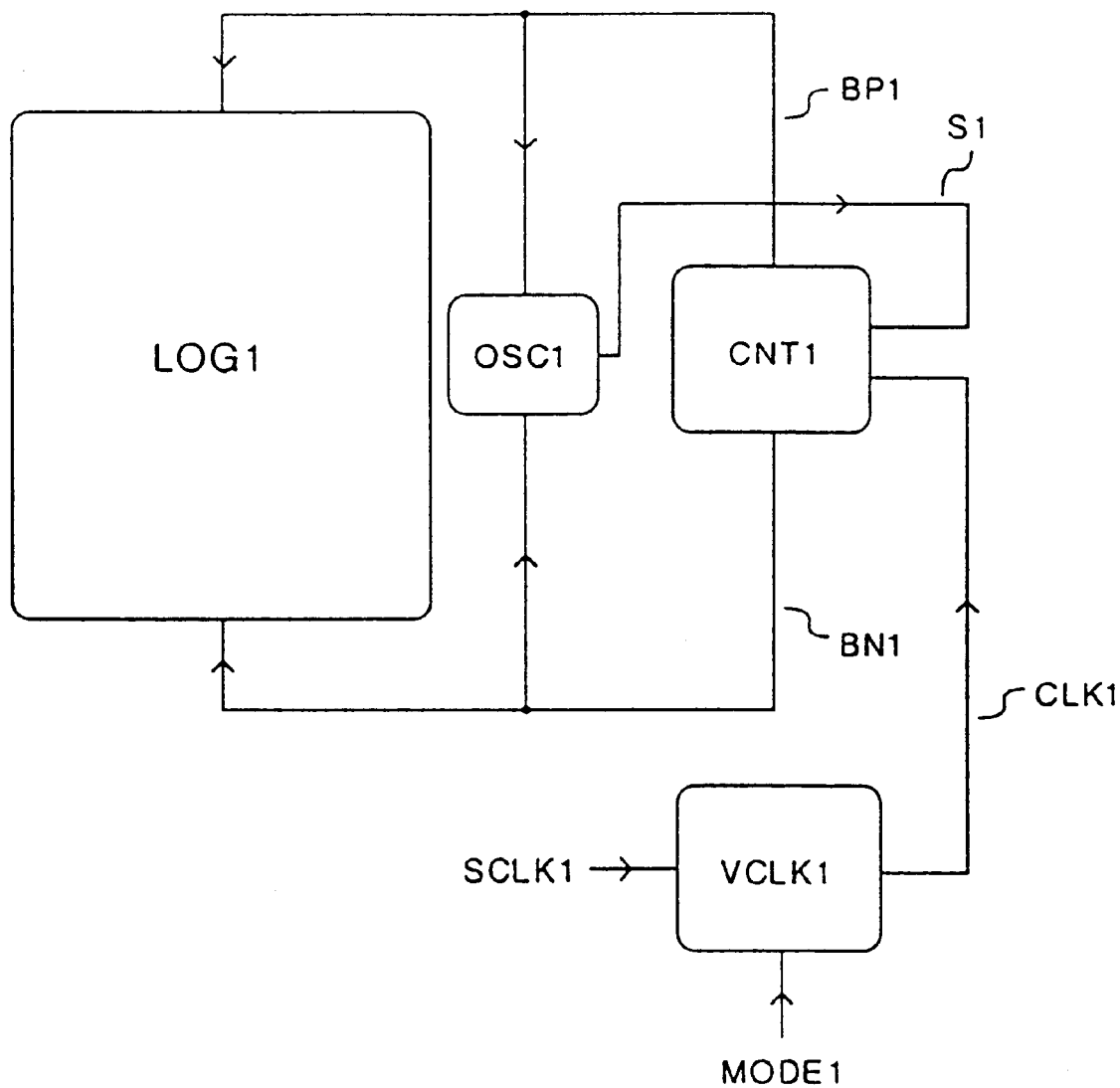
FIG. 3 is a block diagram of the semiconductor integrated circuit based on still another embodiment of this invention.

FIG. 3 shows still another embodiment of this invention, in which the substrate bias of MOS transistors is used for the threshold voltage control.

The semiconductor integrated circuit device includes a main circuit LOG1 and a substrate-bias dependent oscillation circuit OSC1 which varies the oscillation frequency in response to the substrate bias. A substrate bias control circuit CNT1 uses the output S1 of the oscillation circuit OSC1 and the oscillation output CLK1 of an operation-mode dependent oscillation circuit VCLK1 to produce substrate voltages BP1 and BN1 for the main circuit LOG1.

The oscillation circuit OSC1 of this embodiment is a ring oscillator made up of series-connected inverters formed of p-channel MOSFETs and n-channel MOSFETs on a semiconductor substrate. The main circuit LOG1 is a CMOS logic circuit formed of p-channel MOSFETs and n-channel MOSFETs. The substrate bias voltages BP1 and BN1 are applied to the n-substrate (or n-well electrode) of PMOS transistors and to the p-substrate (or p-well electrode) of NMOS transistors, respectively, of the main circuit LOG1.

The operation-mode dependent oscillation circuit VCLK1 which operates based on the system clock SCLK1 as the reference clock to produce an oscillation output CLK1 having a frequency that depends on an internal or external operation mode signal MODE1. The main circuit LOG1 is a logic circuit which operates based on the oscillation output CLK1 as the clock in this embodiment.

The substrate bias voltages BP1 and BN1 are also supplied to the substrate-bias dependent oscillation circuit OSC1. The substrate-bias dependent oscillation circuit OSC1 and the substrate bias control circuit CNT1 which receives the output S1 of the oscillation circuit OSC1 as a feedback signal form a stable negative feedback system so that the output S1 of the oscillation circuit OSC1 has its frequency locked to the frequency of oscillation output CLK1 of the operation-mode dependent oscillation circuit VCLK1.

The operation mode mentioned here is set in advance based on the intended operation speed and power consumption, such as high-speed operation mode, low-speed operation mode and sleep mode, of the main circuit LOG1 in this embodiment.

Since both substrate bias voltages of the substrate-bias dependent oscillation circuit OSC1 and main circuit LOG1 are controlled by the outputs BP1 and BN1 of the substrate bias control circuit CNT1, it is possible to control the substrate bias of the main circuit LOG1 by the oscillation output CLK1 of the operation-mode dependent oscillation circuit VCLK1. The MOS transistors have their threshold voltage varied by the substrate bias voltage, and accordingly it is possible to switch the threshold voltage of MOS transistors of the main circuit LOG1 appropriately to meet the operation mode by switching the operation mode signal MODE1.

Since the main circuit LOG1 has its operation speed and power consumption varied in response to the threshold voltage as mentioned above, it is possible to control the operation speed and power consumption of the main circuit LOG1 appropriately to meet the operation mode by switching the frequency of the clock signal CLK1 supplied to the control circuit CNT1 by use of the operation mode signal MODE1.

Although in this embodiment and following embodiments, the oscillation frequency of the operation-mode dependent oscillation circuit VCLK1 is varied with the signal indicative of the operation mode thereby to produce the oscillation output CLK1, an alternative arrangement is to feed an external clock signal to the control circuit CNT1 directly, as shown in FIG. 1 and FIG. 2. In this case, it becomes possible to control the operation speed and power consumption of the internal main circuit LOG1 through the prior determination of the frequency of the external clock (system clock), and the circuit arrangement can be simplified owing to the elimination of the operation-mode dependent oscillation circuit VCLK1.

Although in this embodiment the substrate bias voltages of both of n-type MOSFETs and p-type MOSFETs are controlled with the BP1 and BN1 voltages, an alternative arrangement is to use one of BP1 and BN1 to vary the substrate bias of MOSFETs of only one type.

More specific circuit arrangements of the foregoing embodiment will be explained in detail in connection with FIG. 4, FIGS. 5A and 5B, and FIG. 6.

Figure 4:
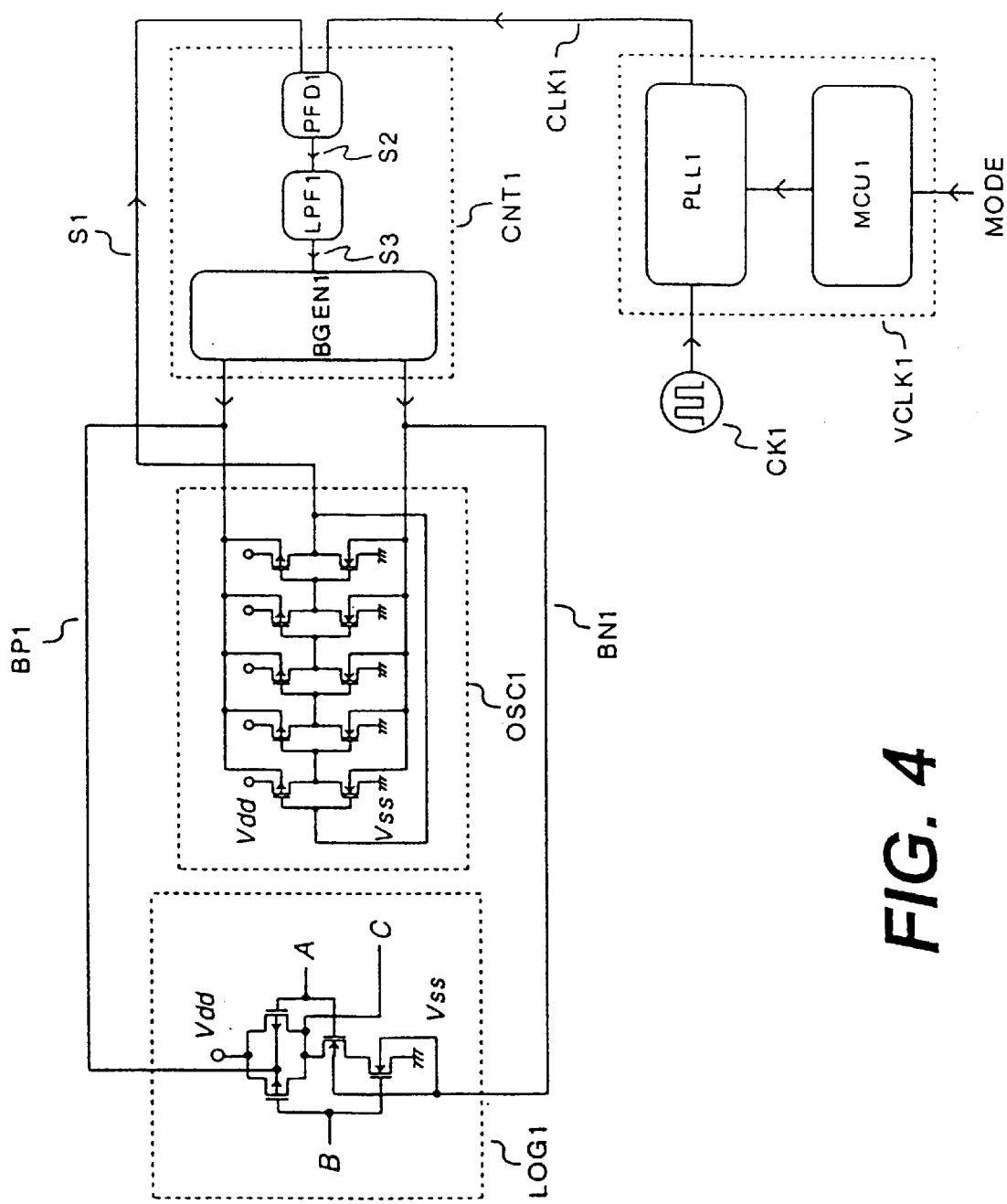
FIG. 4 is a block diagram showing more specific circuit arrangement of the embodiment shown in FIG. 3.

FIG. 4 shows in detail the internal circuit arrangement of each circuit block shown in FIG. 3. The substrate-bias dependent oscillation circuit OSC1 is a ring oscillator made up of 5-stage CMOS inverter circuits (each p-channel or n-channel MOSFET has a gate length of 0.25 $\mu$m and a gate width of 5 $\mu$m). The MOS transistors of the ring oscillator have their substrate electrodes (or well electrodes) used for the oscillation frequency control line.

Figure 5A:
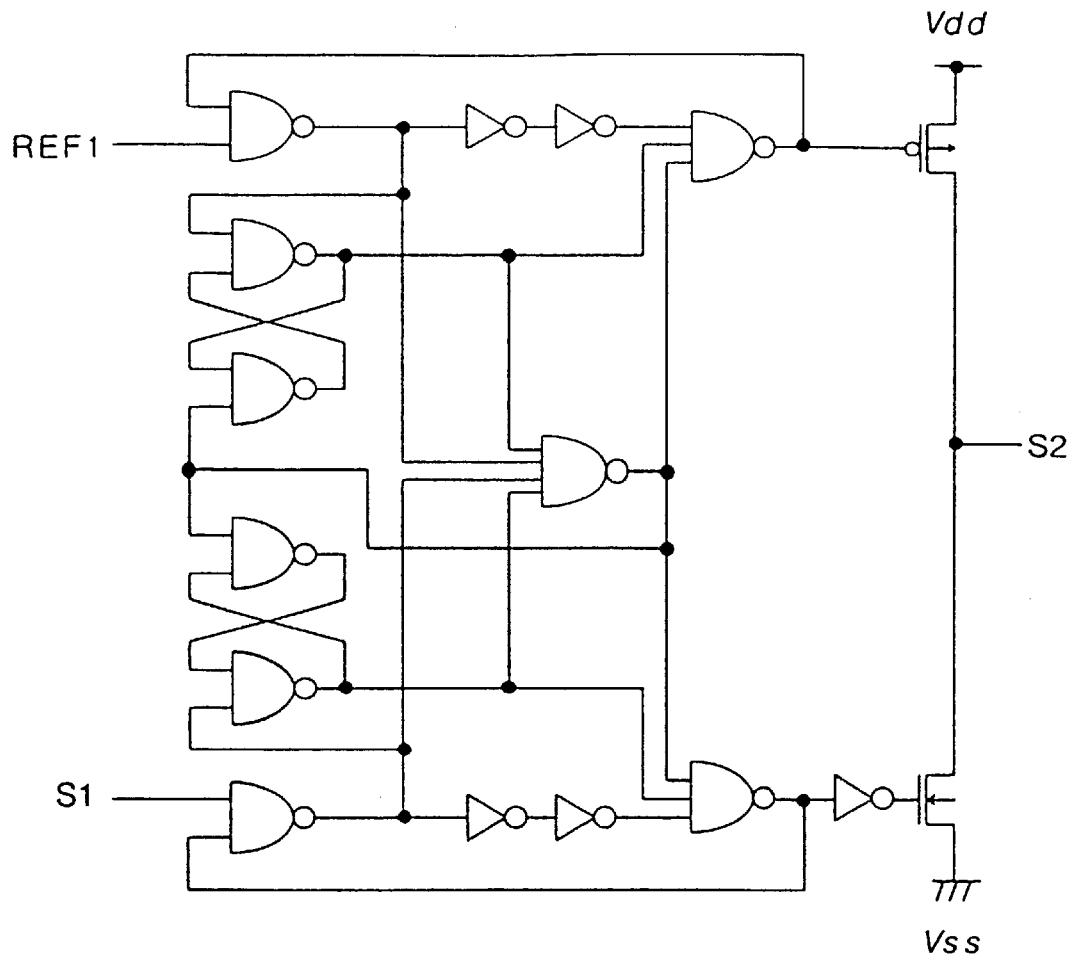
FIGS. 5A and 5B are schematic diagrams each showing the detailed circuit arrangement of the frequency/phase comparator PFD1 and low-pass filter LPF1 used in the circuit shown in FIG. 4.
Figure 5B:
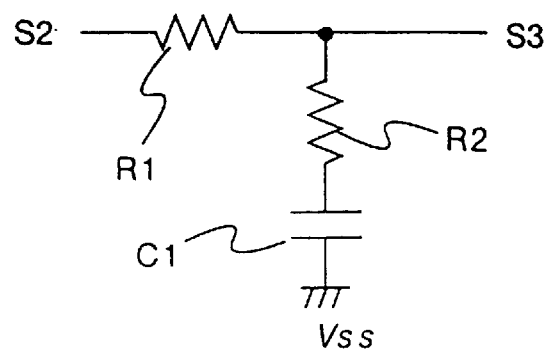

The main circuit LOG1 is a CMOS logic circuit (gate length: 0.25 $\mu$m; gate width: 5 $\mu$m) of 2-input NAND gate having input signals A and B and an output signal C as an example of this embodiment. The substrate bias control circuit CNT1 consists of a substrate bias generation circuit BGEN1, a low-pass filter LPF1 and a frequency/phase comparator PFD1. FIG. 5A shows the specific circuit arrangement of the frequency/phase comparator PFD1, and FIG. 5B shows the specific circuit arrangement of the low-pass filter LPF1.

The frequency/phase comparator PFD1, which has a well-known circuit arrangement, receives a reference frequency signal REF1 and a signal S1 of a certain frequency and produces an output signal S2 indicative of the phase difference of the two input signals. The low-pass filter LPF1 is a well-known lag-lead filter formed of resistors and a capacitor. Further explanation of these circuit blocks are omitted.

The substrate bias generation circuit BGEN1 is a DC-to-DC converter for converting the output voltage S3 of the low-pass filter LPF1 into an optimal voltage level for the substrate bias. The control signal BP1 delivered by the substrate bias generation circuit BGEN1 is higher than the power voltage Vdd, while the control signal BN1 is lower than the ground voltage Vss.

The control signals BP1 and BN1 and the output voltage S3 of the low-pass filter LPF1 have the following relationship. If the frequency of output S1 of the oscillation circuit OSC1 is lower than the frequency of the clock signal CLK1 as the reference signal REF1, the low-pass filter LPF1 shown in FIG. 5B responds to the output S2 of the frequency/phase comparator PFD1 shown in FIG. 5A to produce a voltage (detected signal) S3 having a relatively lower voltage level close to the ground voltage Vss. In response to the lower detected signal S3, the control signal BP1 has relatively lower voltage level close to the power voltage Vdd, and the control signal BN1 has a relatively lower voltage level close to the ground voltage Vss.

Otherwise, if the frequency of the oscillation output S1 is higher than the frequency of the clock signal CLK1, the low-pass filter LPF1 delivers a detected signal S3 having a relatively higher voltage level close to the power voltage Vdd. In response to the higher detected signal S3, the control signal BP1 has a relatively higher voltage level above the power voltage Vdd and the control signal BN1 has a deeply low voltage level below the ground voltage Vss.

The control signals BP1 and BN1 have voltage levels that are beyond the operational voltage range Vdd-Vss of the circuit and have a complementary transition of voltage levels in response to the detected signal S3. Through the control of conductance of MOSFETs based on the control of substrate bias as described above, the oscillation circuit OSC1 and main circuit LOG1 operate as intended.

The substrate bias generation circuit BGEN1 which produces these control signals BP1 and BN1 can be configured in a relatively simple circuit arrangement including a substrate bias oscillation circuit, voltage level control circuit, positive charge pump circuit, and negative charge pump circuit, for example. In this case, the voltage level control circuit controls the level of the oscillation signal fed to the positive charge pump circuit and negative charge pump circuit in accordance with the output S3 of the low-pass filter LPF1.

The voltage level control circuit, which receives the output S3 of the low-pass filter LPF1, is configured as a voltage follower circuit formed of a MOS operational amplifier, for example. The output of the voltage follower circuit is considered to be an internal voltage source, and it is used at least for the power source of the oscillation signal output circuit of the substrate bias oscillation circuit. Based on this circuit arrangement, the oscillation signal output circuit has its output signal level determined by that power voltage, and it is controlled to have a voltage level which corresponds to the voltage level of the output S3 of the low-pass filter LPF1.

The positive charge pump circuit is made up of a positive charge pump capacitor which consists of a MOS capacitor having its one terminal coupled to the output terminal of the oscillation signal output circuit, a first rectifying element which consists of a p-channel MOSFET in diode configuration having its source connected to the power terminal Vdd and its gate and drain connected to another terminal of the positive charge pump capacitor, and a second rectifying element which consists of a p-channel MOSFET in diode configuration having its source connected to the other terminal of the capacitor and its gate and drain connected to the substrate gates of the p-channel MOSFETs of the main circuit LOG1 and oscillation circuit OSC1. The positive charge pump circuit provides periodically a positive charge to the substrate gate of the p-channel MOSFETs in response to the oscillation signal from the substrate bias oscillation circuit. This positive charge is smoothed by a parasitic capacitance such as a junction capacitance existing in the substrate gate, and it provides the substrate gate with a bias voltage as the control signal BP1.

The negative charge pump circuit is made up of an negative charge pump capacitor which consists of a MOS capacitor having its one terminal coupled to the output terminal of the oscillation signal output circuit, a third rectifying element which consists of an n-channel MOSFET in diode configuration having its source connected to the ground terminal Vss and its gate and drain connected to another terminal of the negative charge pump capacitor, and a fourth rectifying element which consists of an n-channel MOSFET in diode configuration having its source connected to substrate gates of the n-channel MOSFETs of the main circuit LOG1 and oscillation circuit OSC1 and its gate and drain connected to the other terminal of the negative charge pump capacitor.

In case another voltage source such as an external power source having an output voltage level higher than the power voltage Vdd is available, the circuit for producing the control signal BP1 in the substrate bias generation circuit BGEN1 may be arranged as follows. A level conversion circuit or level shift circuit which is supplied with power by the above-mentioned another voltage source is provided, by which the control signal BP1 is produced from the output of the low-pass filter LPF1 through the conversion or level shift. Similarly, in case another voltage source such as an external power source having an output voltage level lower than the ground voltage Vss is available, the control signal BN1 may be produced by use of a similar level conversion circuit or level shift circuit.

In the case of using these level conversion circuit or level shift circuit, it becomes possible to reduce the number of relatively large circuit components such as the charge pump capacitors, and also reduce the transitional current of charge pump operation which can create noises in the power wiring system.

In FIG. 4, the operation-mode dependent oscillation circuit VCLK1 is made up of a frequency multiplier PLL1 and operation mode control circuit MCU1. A fixed-frequency oscillator CK1 is used for the reference clock source of the operation-mode dependent oscillation circuit VCLK1.

The frequency multiplier PLL1 has its multiplying factor varied by the operation mode control circuit MCU1 in accordance with a mode control signal MODE associated with the operation of the main circuit LOG1. The output frequency of the fixed-frequency oscillator CK1 is multiplied by a multiplying factor that depends on the operation mode of the main circuit LOG1, and a resulting oscillation output CLK1 with a rectangular waveform and a frequency f0 (ranging from 0 to 100 MHz) is released from the frequency multiplier PLL1.

The oscillation output S1 of the CMOS ring oscillator OSC1 is fed together with the oscillation output CLK1 of the frequency multiplier PLL1 to the frequency/phase comparator PFD1, which has its output S2 fed through the low-pass filter LPF1 to the substrate bias generation circuit BGEN1, by which the substrate bias voltages BP1 and BN1 are produced.

The substrate bias voltages BP1 and BN1 are applied commonly to the CMOS ring oscillator OSC1 and main circuit LOG1. The substrate bias voltage BN1 is applied commonly to the substrate electrodes of n-type MOSFETs (transistors with gate-pointing arrows at the channel section), while the substrate bias voltage BP1 is applied commonly to the substrate electrodes of p-type MOSFETs (transistors with gate-originating arrows at the channel section), as shown in FIG. 4. These transistors have their operating point set so as to operate in a low voltage range of about 1 V based on a power voltage Vdd of about 1 V and a ground voltage Vss.

Figure 7A:
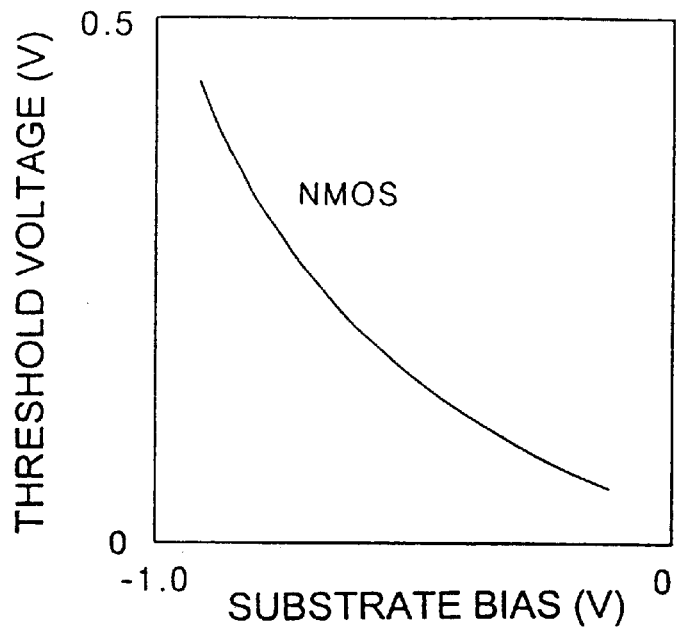
FIGS. 7A and 7B are graphs showing the relation of the substrate bias and the threshold voltage of an NMOS transistor and PMOS transistor, respectively.
Figure 7B:
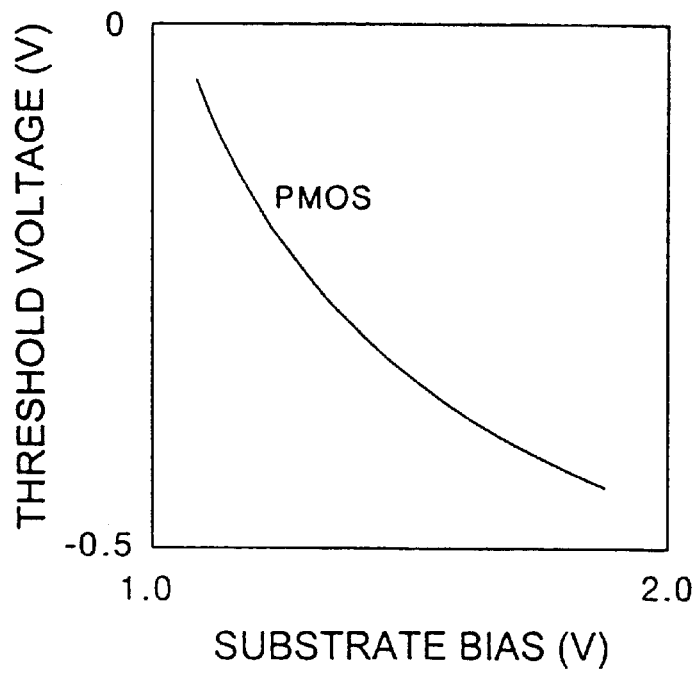

FIGS. 7A and 7B show the relationship of the substrate bias voltage and threshold voltage of the MOS transistors. FIG. 7A is for the NMOS transistors, and FIG. 7B is for the PMOS transistors.

The MOS transistors have their threshold voltage varied depending on the substrate bias as shown in FIGS. 7A and 7B and have a reduced current drive ability for a smaller value of threshold voltage in general, and accordingly the CMOS ring oscillator OSC1 of FIG. 4 operates as a voltage-controlled oscillator (VC0) in response to the substrate bias signals BP1 and BN1. On this account, the whole circuit of FIG. 4 has a structure of phase-locked loop (PLL) and operates so that the oscillation frequency and phase of the CMOS ring oscillator OSC1 coincide with those of the oscillation output CLK1 of the frequency multiplier PLL1.

The oscillation circuit (VC0) and PLL circuit of this embodiment enable to build an oscillation circuit having a wide frequency range and a PLL circuit capable of following an external high-frequency clock signal, and also enable the control of operation speed and power consumption of the main circuit depending on the external clock frequency. The PLL circuit is described in publication "IEEE JOURNAL OF SOLID-STATE CIRCUITS", Vol. 22, No. 2 (April 1987), pp. 255–261, for example.

Figure 6:
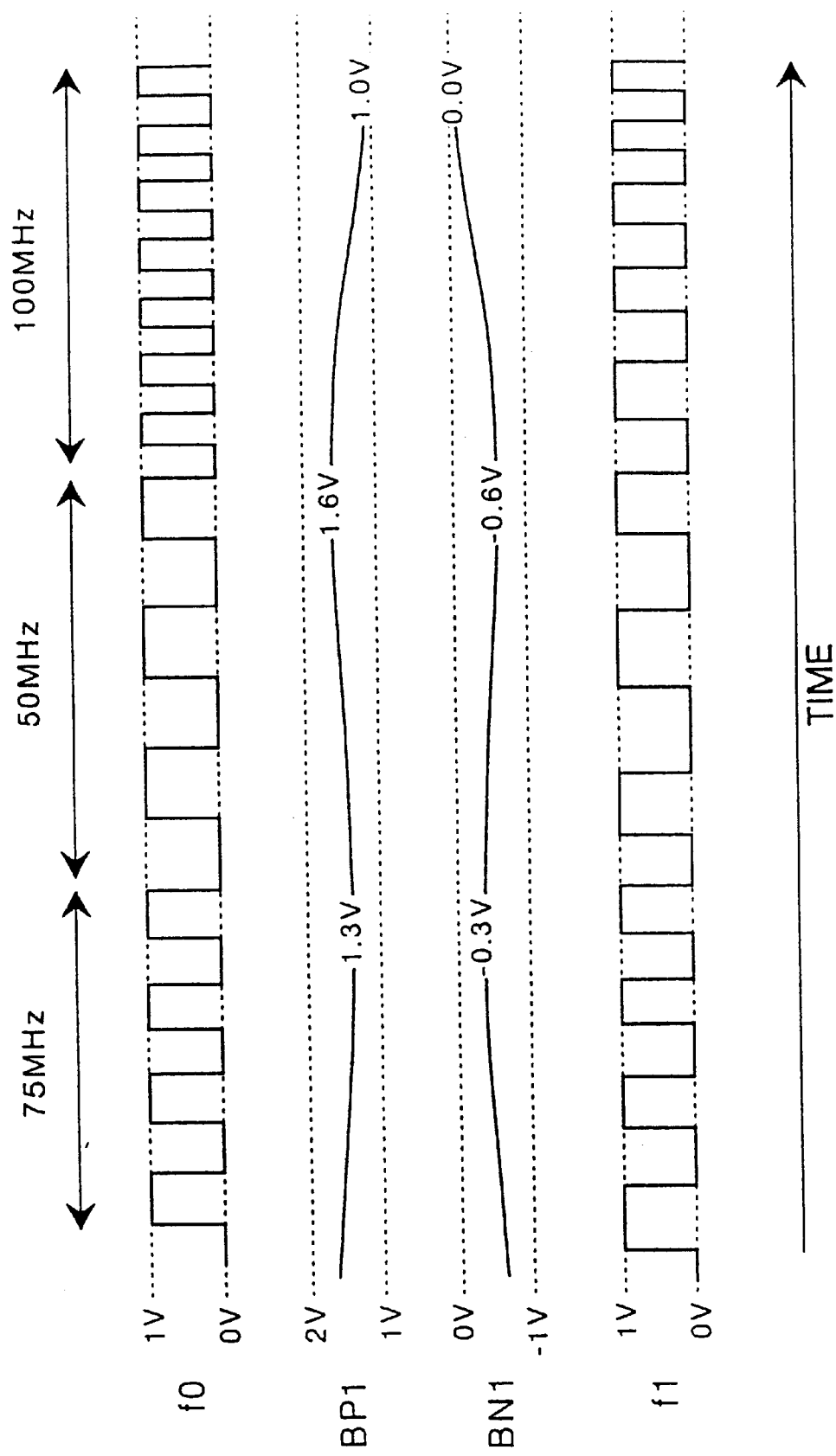
FIG. 6 is a timing chart showing the relation of the operation frequency and the substrate bias of the embodiment shown in FIG. 4.

Next, the variation of the substrate bias voltages BP1 and BN1 and threshold voltage of the MOS transistors of the main circuit LOG1 in response to the switching of operation mode of the main circuit LOG1 will be explained in connection with the timing chart of FIG. 6.

When the operation mode is switched, the operation mode control circuit MCU1 switches the frequency multiplying factor of the frequency multiplier PLL1, and its oscillation output CLK1 varies. In this example, the frequency f0 varies with time from 75 MHz to 50 MHz. Consequently, the substrate bias voltage BP1 rises from 1.3 V to about 1.6 V, and the substrate bias voltage BN1 falls from −0.3 V to about −0.6 V. Consequently, the threshold voltage of MOS transistors rises (refer to FIGS. 7A and 7B), causing the oscillation frequency f1 of the substrate-bias dependent oscillation circuit OSC1 to fall gradually to become equal to the frequency f0 (50 MHz) of oscillation output CLK1 of the frequency multiplier PLL1. At the same time, the output of the circuit OSC1 becomes in-phase with the oscillation output CLK1 of the frequency multiplier PLL1.

If the frequency f0 of the oscillation output CLE1 of the frequency multiplier PLL1 rises from 50 MHz to 100 MHz in response to the switching of the operation mode signal MODE, the substrate bias voltage BP1 falls from 1.6 V to about 1.0 V and the substrate bias voltage BN1 rises from −0.6 V to about 0 V. Consequently, the threshold voltage of MOS transistors falls (refer to FIGS. 7A and 7B), causing the oscillation frequency fl of the substrate-bias dependent oscillation circuit OSC1 to rise gradually to become equal to the frequency f0 (100 MHz) of oscillation output CLK1 of the frequency multiplier PLL1.

Figure 8:
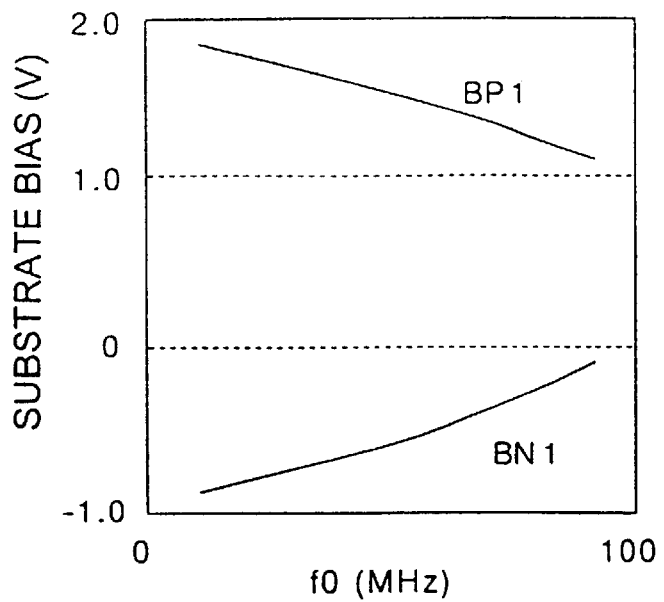
FIG. 8 is a graph showing the relation of the operation frequency and the substrate bias of a MOS transistor.

FIG. 8 shows the relationship of the frequency f0 of oscillation output CLK1 and the substrate bias voltages BP1 and BN1 of the frequency multiplier PLL1. In this manner, the substrate bias of the MOS transistors of the substrate-bias dependent oscillation circuit OSC1 can be varied depending on the oscillation output CLK1 of the frequency multiplier PLL1, and the threshold voltage of the MOS transistors can be varied accordingly.

Although the frequency f0 of oscillation output CLK1 is switched among 50 MHz, 75 MHz and 100 MHz in this embodiment, arbitrary oscillation frequencies that meet the control range of threshold voltage can be chosen obviously. It is possible for this embodiment to set the oscillation frequency f1 of the CMOS ring oscillator OSC1 to a preset value, enabling the estimation of the signal propagation delay time of MOS transistors of the main circuit LOG1 in each operation mode.

Figure 9:
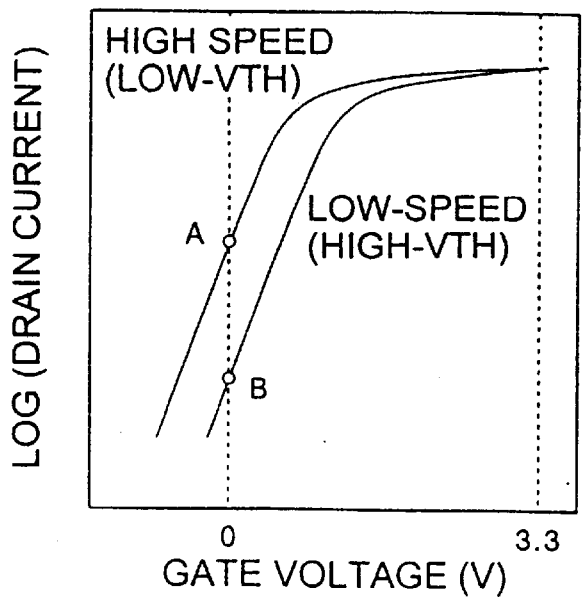
FIG. 9 is a graph showing the relation of the gate voltage and the drain current of a MOS transistor.

FIG. 9 shows the gate voltage dependency of MOS transistors in their subthreshold region of the drain current.

Generally, the lower the threshold voltage of MOS transistors, the greater is their driving ability, enabling higher-speed operation. However, the comparison of points A and B in FIG. 9 reveals that the on-off ratio of MOS transistors decreases, the subthreshold current increases, and the power consumption increases.

According to the inventive circuit arrangement, it is possible in case in need of high-speed operation to lower the threshold voltage of MOS transistors of the main circuit LOG1 by choosing from outside an operation mode for a higher oscillation frequency of the output CLK1 of frequency multiplier PLL1. Although in this case the subthreshold current and power consumption of main circuit LOG1 increase, it can operate at a higher speed. It is also possible in case in need of low-speed operation to raise the threshold voltage of MOS transistors of the main circuit LOG1 by choosing from outside an operation mode for a lower oscillation frequency of the output CLK1 of frequency multiplier PLL1, thereby reducing the subthreshold current and power consumption of the main circuit LOG1.

Figure 10:
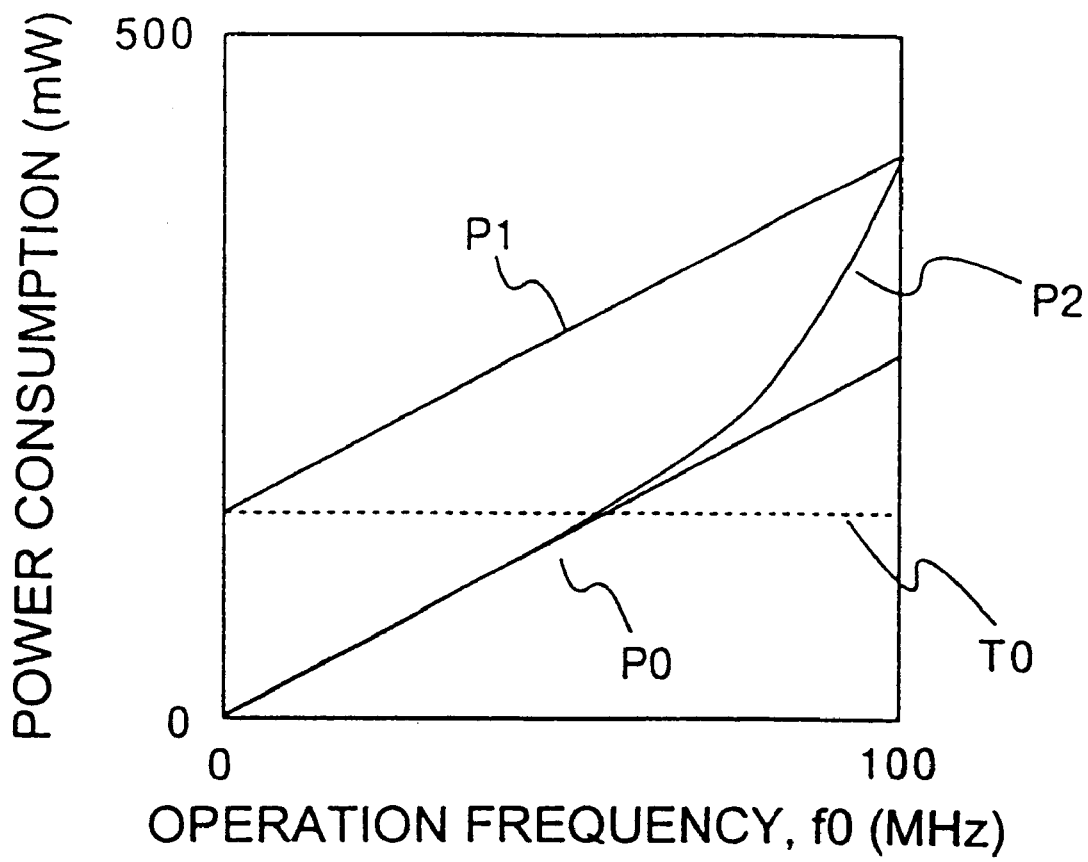
FIG. 10 is a graph showing the relation of the operation frequency and the power consumption based on an embodiment of this invention.

FIG. 10 shows these affairs. Shown by curve P2 is the power consumption of the main circuit LOG1 when the operation mode signal MODE is varied to vary the frequency f0 of oscillation output CLK1 of the frequency multiplier PLL1. The main circuit LOG1 operates at the same frequency f0 of the oscillation output CLK1 of PLL1 in this example. Shown by line P0 is the power consumption of LOG1 of the case without power a loss in subthreshold current T0, and shown by line P1 is the case with the subthreshold current T0.

The power consumption of the main circuit LOG1 has a linear relationship with its operation frequency f0 as shown. The subthreshold current does not depend on the operation frequency f0, and line P1 is parallel to line P0. In the case of the line P2 relevant to this invention, the threshold voltage which relates with the subthreshold current varies with the operation frequency f0, and the power consumption approaches the P0 without power loss in subthreshold current as the operation frequency f0 falls in response to the operation mode signal. Consequently, the main circuit LOG1 can be operated at a minimal power consumption caused by a minimal subthreshold current needed for the operation at the operation frequency f0. This effect is particularly significant for the low-voltage operation at around 1 V in which case the subthreshold current is a matter and for the higher-density circuit integration.

Since the threshold voltage of the main circuit LOG1 is controlled automatically to take the preset value depending on the operation mode of the main circuit LOG1, the inventive circuit arrangement can cope with unequal characteristics among MOS transistors of the main circuit LOG1 and external varying factors such as the temperature and power voltage.

Although shown in FIG. 4 is a 2-input NAND gate as an example of the main circuit LOG1 of FIG. 3, it can be an inverter or other logic gates such as a NOR gate, or can be a logic circuit made up of these logic gates. The main circuit LOG1 of CMOS transistors can alternatively be formed of NMOS transistors and/or PMOS transistors, or even can include bipolar transistors. The CMOS ring oscillator shown in FIG. 4 can also be any other oscillation circuit that varies the output frequency in response to the substrate bias.

Figure 11:
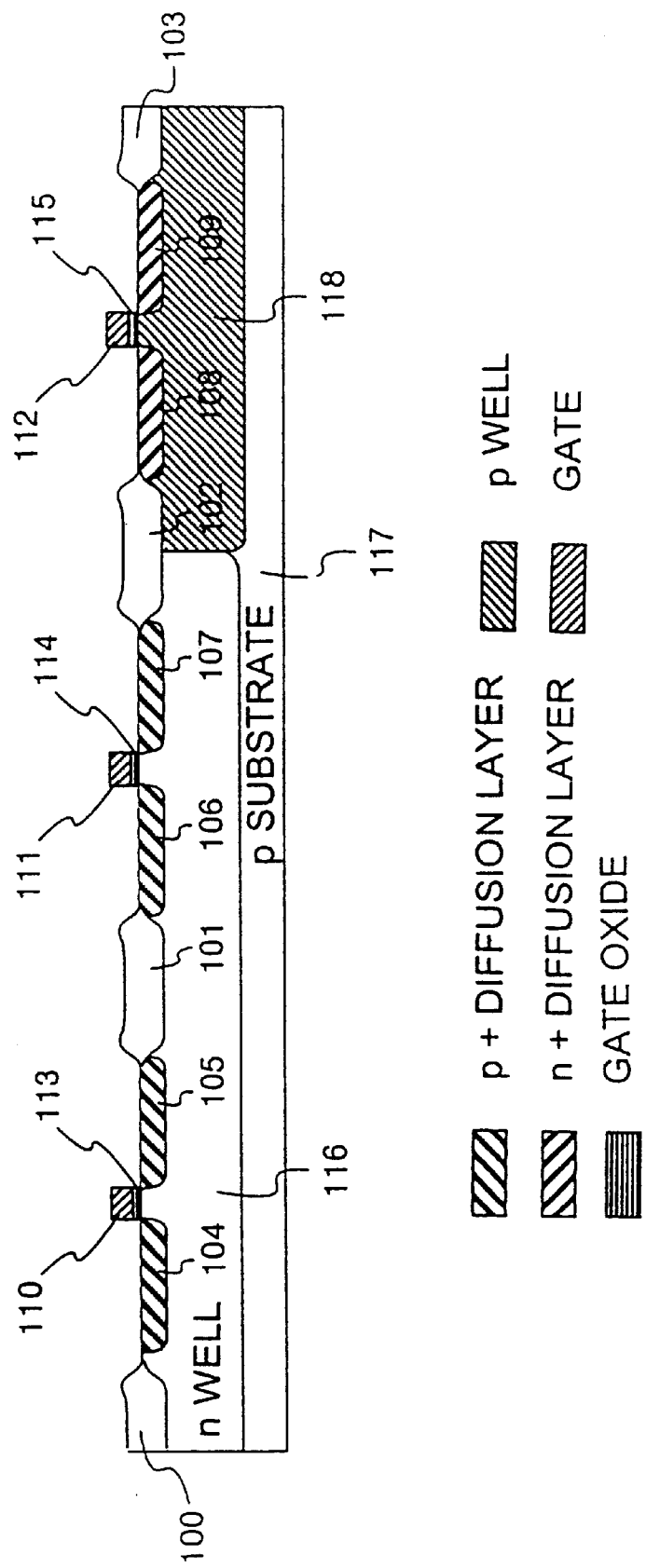
FIG. 11 is a cross-sectional diagram showing an example of the device structure of the semiconductor integrated circuit based on an embodiment of this invention.

FIG. 11 shows the cross section of the CMOS structure for fabricating the integrated circuit shown in FIG. 4.

N well 116 and p well 118 are formed on part of a p-type silicon substrate 117. Formed on the surface of the n well 116 is a PMOS transistor consisting of a p+ type source, drain diffusion regions 104 and 105, a gate electrode 110 and a gate oxide film 113, and formed on the surface of the p well 118 is an NMOS transistor consisting of an n+ type source, drain diffusion regions 108 and 109, a gate electrode 108 and a gate oxide film 115. Device isolation films 100, 101 and 102 are formed between the PMOS transistor and NMOS transistor. Power lines for supply the substrate bias voltages BP1 and BN1 to the PMOS transistor and NMOS transistor are connected to the respective well regions, although these lines are not shown in the figure.

An n-type substrate may be used instead of the p-type substrate of this example. Instead of the twin well structure using the n well 116 and p well 118 in the example of FIG. 11, a single well structure, with one of the n well and p well being substituted by the substrate, may be used.

MOS transistors of the triple well structure as described in publication "ISSCC Digest of Technical Papers" (Feb. 1989), pp. 248–249, or MOS transistors of the SOI structure as described in publication "1992 IEDM Technical Digest", pp. 35–38 may be formed.

Although in the foregoing embodiments, the substrate bias voltage for NMOS transistors is 0 V or lower and that of PMOS transistors is the power voltage (e.g., 1.0 V) of the main circuit or higher, it may be applied so as to provide a forward bias for the pn junction between the diffusion layer of MOS transistors and the substrate.

Particularly, in case the forward bias voltage does not exceed the diffusion potential (around 0.6 V), the leakage current between the diffusion layer and substrate is small enough to prevent an increased power consumption, enabling the application of a forward bias. In this case, the substrate bias factor of the threshold voltage (the variation of threshold voltage against the substrate bias) is large in the substrate bias region, and therefore the threshold voltage of MOS transistors can be controlled efficiently. Another advantage is the elimination of the need of a special substrate biasing circuit such as a negative voltage source owing to the setting of the substrate bias voltage within the range of power voltage.

Although in the foregoing embodiments, the threshold voltage of MOS transistors of the main circuit is controlled through the control of substrate bias, an alternative scheme is to configure a main circuit with MOS transistors having a threshold voltage control terminal (e.g., SOIMOSFETs having an electrode that is insulated from the silicon substrate) and apply a substrate bias control voltage to the terminal.

Figure 12:
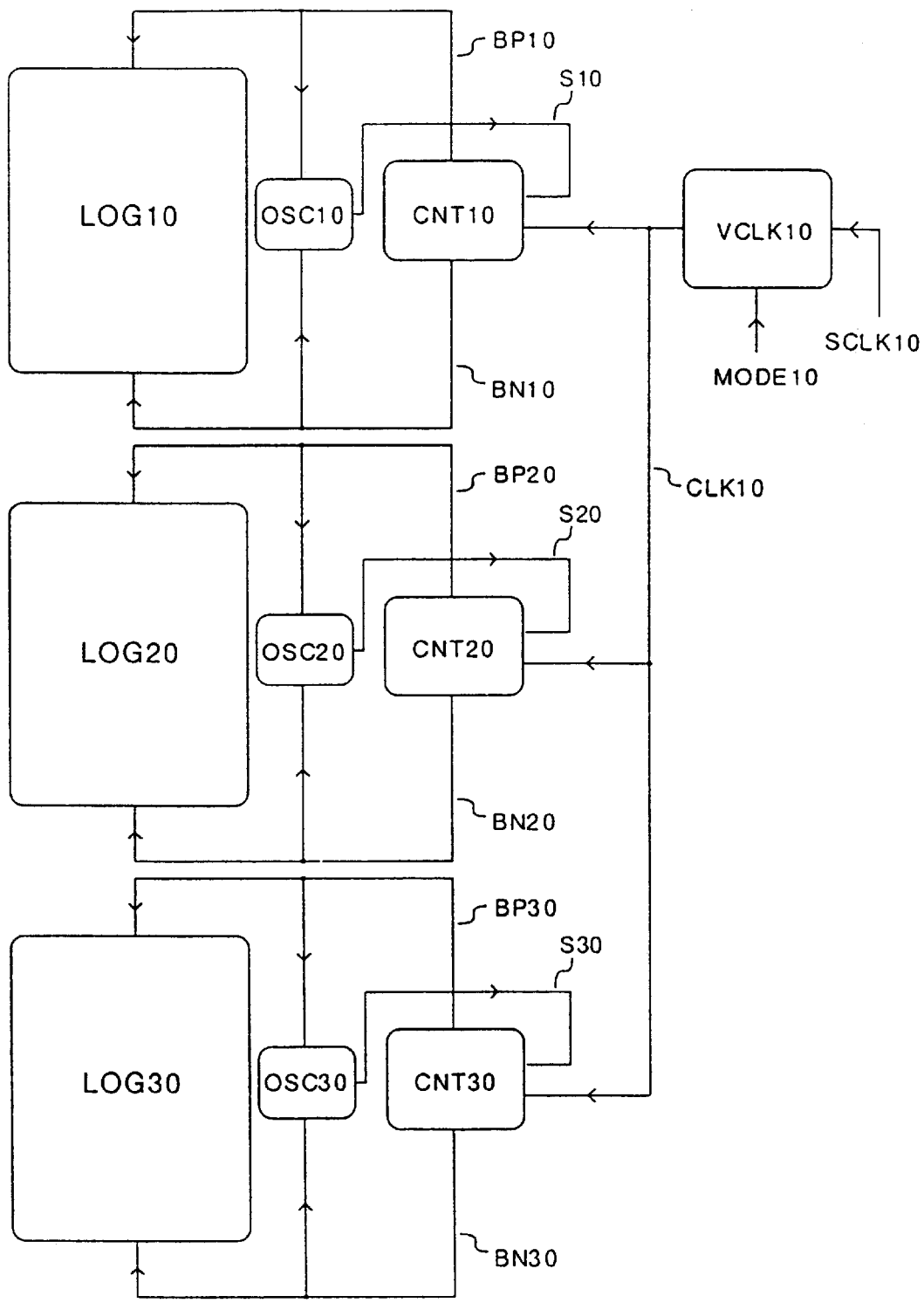
FIG. 12 is a block diagram of the semiconductor integrated circuit based on still another embodiment of this invention.

FIG. 12 shows an embodiment of the configuration of a main circuit LOG1 that is divided into circuit blocks LOG10, LOG20 and LOG30. The circuit blocks LOG10–LOG30 have their substrate bias voltages BP10–BP30 and BN10–BN30 controlled by the oscillation output CLK10 of a single operation-mode dependent oscillation circuit VCLK10. The oscillation output CLK10 of the circuit VCLK10 is fed commonly to the control circuits CNT10–CNT30 that are provided along with oscillation circuits OSC10–OSC30 for the respective circuit blocks LOG10–LOG30. The operation-mode dependent oscillation circuit VCLK10 and each of the control circuits CNT10–CNT30 and oscillation circuits OSC10–OSC30 are arranged as shown in FIG. 4.

In this embodiment, the substrate bias of the circuit blocks LOG10–LOG30 are controlled independently by the oscillation output CLK10 of the operation-mode dependent oscillation circuit VCLK10. Accordingly, it is possible to compensate the unequality of threshold voltage and substrate bias characteristics of MOS transistors among the circuit blocks LOG10–LOG30. In case MOS transistors of the main circuit LOG10 have a threshold voltage different from that of other circuits due to the manufacturing process, MOS transistors of the oscillation circuit OSC10 conceivably have the same variation of threshold voltage, and the substrate bias for these MOS transistors can be controlled appropriately by the clock signal CLK10. Specifically, in case the threshold voltage differs by 0.15 V among the circuit blocks LOG10–LOG30, the difference can be reduced to around 0.05 V according to this embodiment.

Since the unequality of circuit characteristics attributable to the manufacturing process is dependent on the location on the semiconductor chip of the semiconductor integrated circuit, it is desirable to arrange each main circuit LOG and associated oscillation circuit OSC close to each other. Similarly, in dividing a main circuit into circuit blocks, it is desirable to partition a semiconductor chip symmetrically into two, four, or the like so that a circuit block is configured with transistors that are close to each other.

The allowable range of threshold voltage has its lower limit determined from the subthreshold leakage current and its upper limit determined from the required operation speed, as mentioned previously. On this account, it is obliged conventionally to set a higher threshold voltage against high-speed circuit operation when the threshold voltage differ greatly among transistors, whereas the scheme of this embodiment allows the setting of threshold voltage to its lower limit, enabling the high-speed circuit operation.

The effectiveness of these embodiments is particularly significant for the low-voltage operation at a power voltage of around 1 V.

Figure 13:
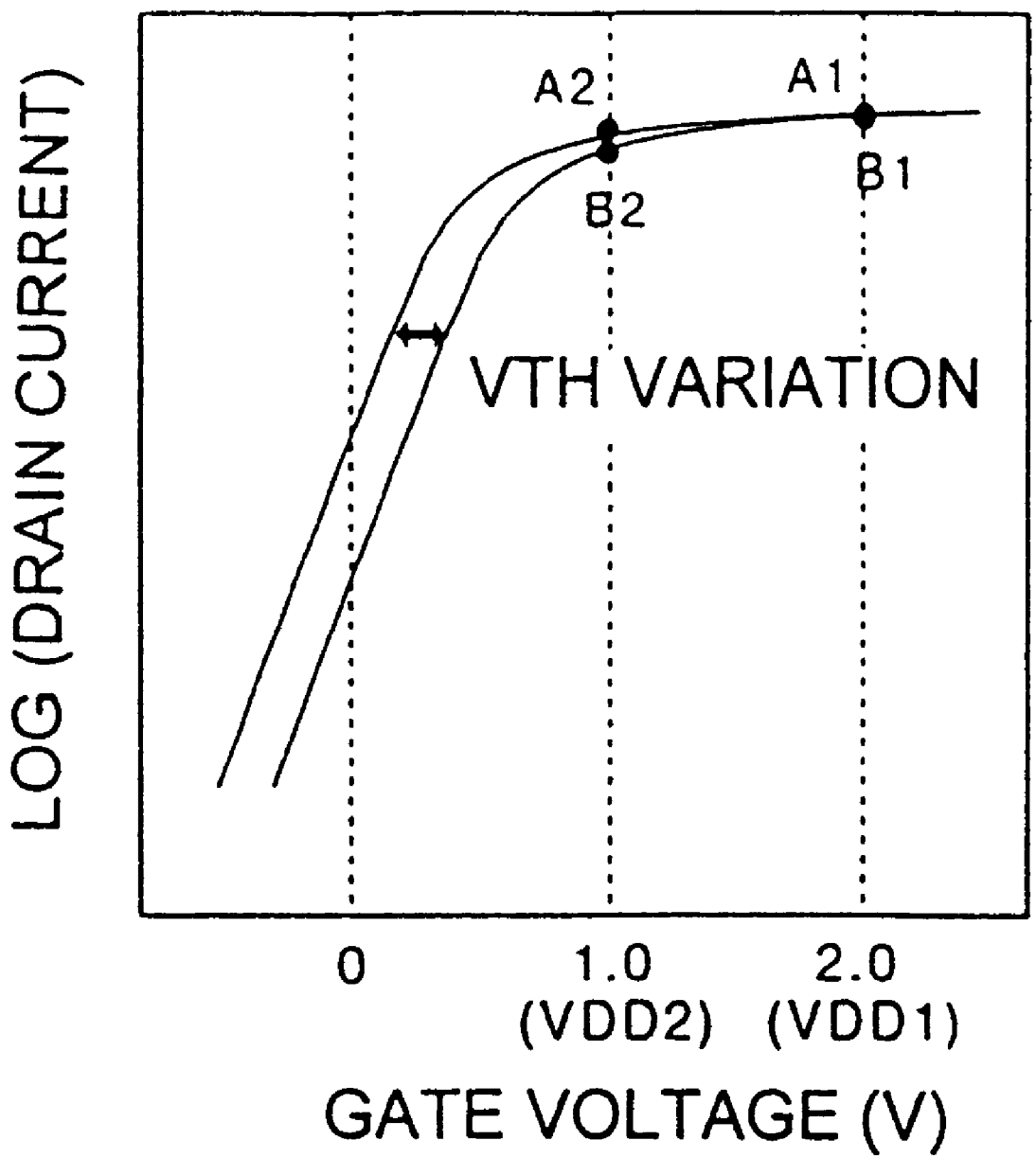
FIG. 13 is a graph showing the relation of the gate voltage and the drain current of the inventive MOS transistor.

FIG. 13 shows this affair, showing the variation of drain current when the threshold voltage varies against the gate voltage applied to the gate terminal. For a relatively high power voltage of VDD1=2.0 V, there is little variation of drain current caused by the variation of threshold voltage as shown by the distance of points A1 and B1, whereas for a relatively low power voltage of VDD2=1.0 V, the drain current is varied greatly by the variation of threshold voltage as shown by the distance of points A2 and B2. The distance of these points further expands when the power voltage is 1 V or lower.

Figure 14:
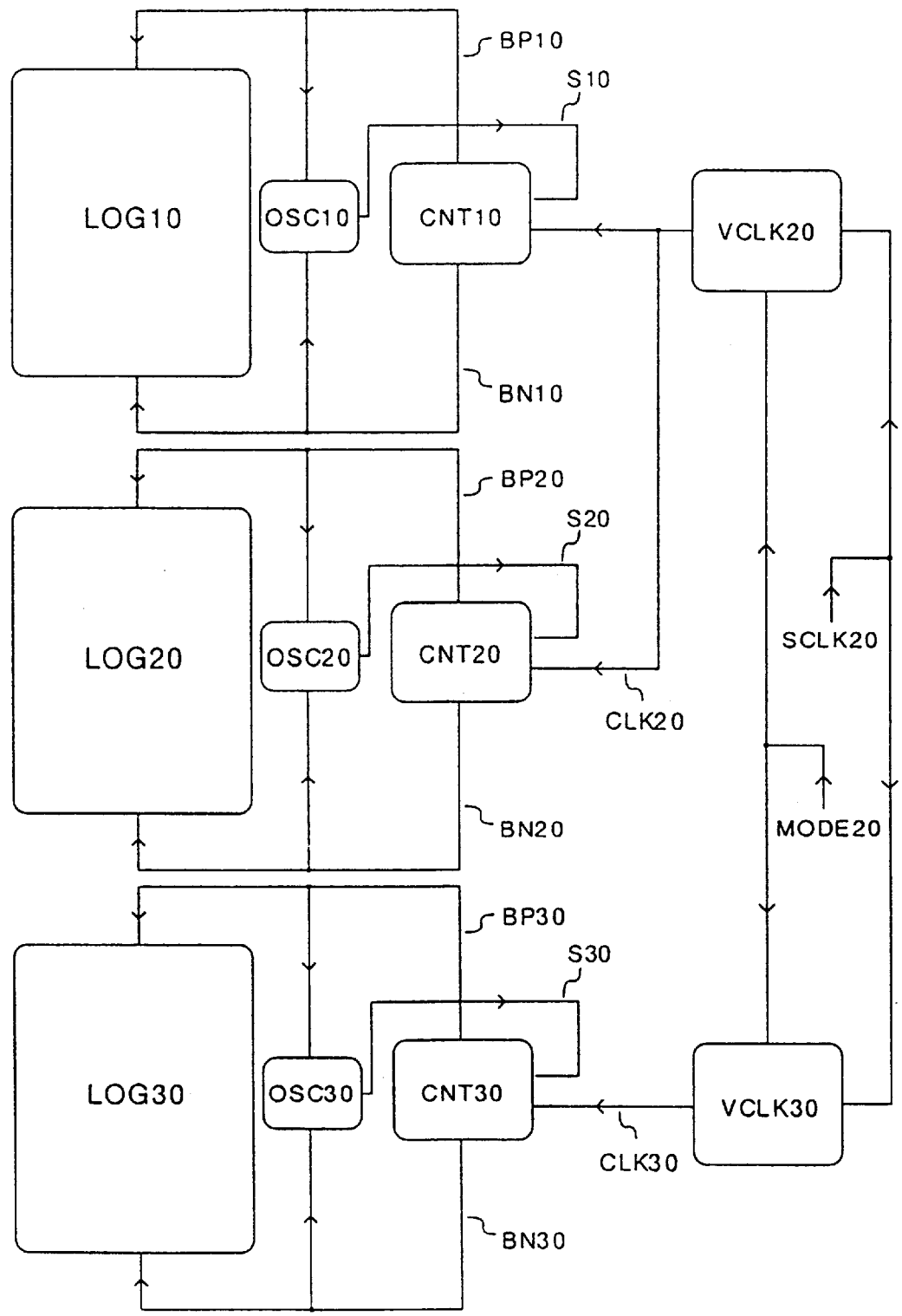
FIG. 14 is a block diagram of the semiconductor integrated circuit based on still another embodiment of this invention.
Figure 15:
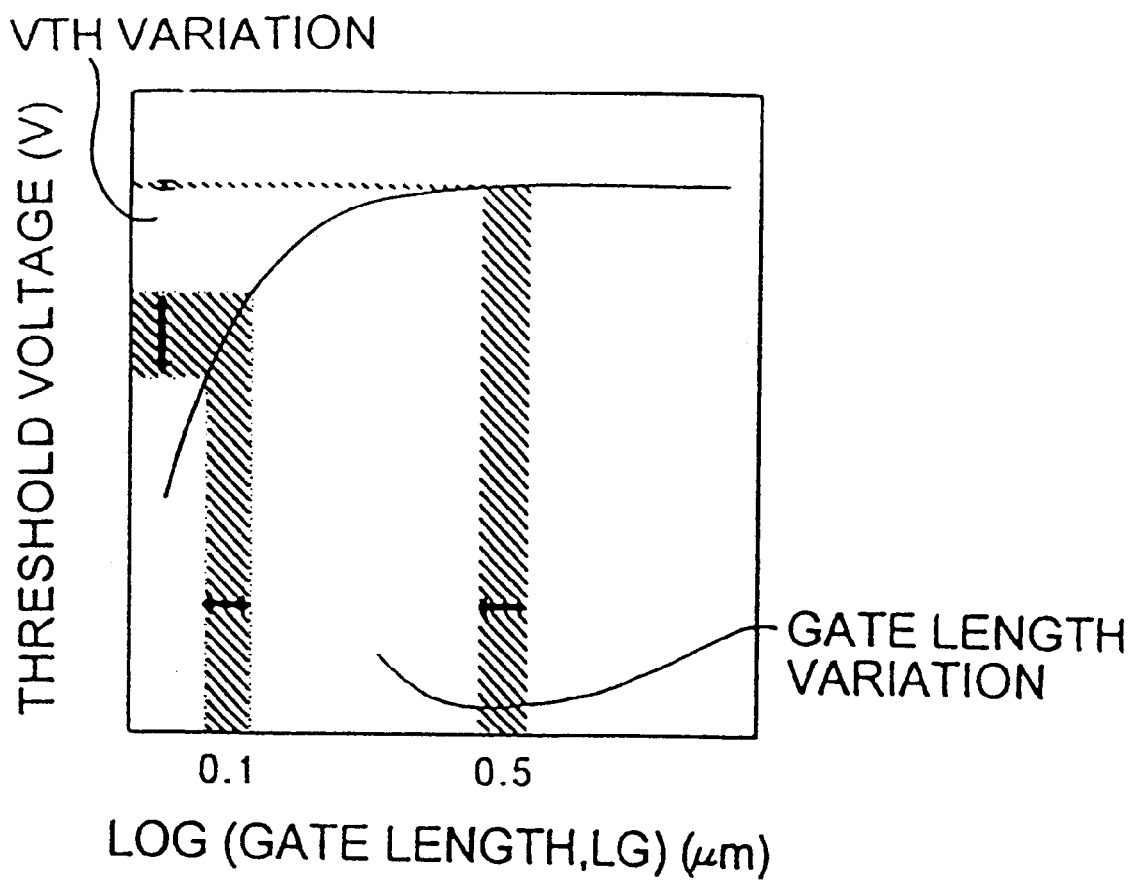
FIG. 15 is a graph showing the relation of the gate length and the threshold voltage of the inventive MOS transistor.

As a variant embodiment derived from the embodiment of FIG. 12, in which the circuit blocks LOG10–LOG30 are supplied with a common oscillation output CLK10 from one operation-mode dependent oscillation circuit VCLK10, two operation-mode dependent oscillation circuits VCLK20 and VCLK30 may be provided as shown in FIG. 14. The two oscillation circuits VCLK20 and VCLK30 are supplied with a common system clock SCLK20 and mode signal MODE20.

The circuit blocks LOG10–LOG30 have individual oscillation circuits OSC10–OSC30 and control circuits CNT10–CNT30, of which the control circuits CNT10 and CNT20 are commonly supplied with the oscillation output CLK20 of the oscillation circuit VCLK20 and the control circuit CNT30 is supplied with the oscillation output CLK30 of the oscillation circuit VCLK30.

The operation-mode dependent oscillation circuits VCLK20 and VCLK30, control circuits CNT10–CNT30, and oscillation circuits OSC10–OSC30 are arranged as shown in FIG. 4. The scheme of controlling multiple circuit blocks LOG10 and LOG20 with a single operation-mode dependent oscillation circuit VCLK20 is identical to the embodiment of FIG. 12, and the same effectiveness is attained.

Based on this circuit arrangement, circuit blocks, e.g., LOG10 and LOG30, can be controlled separately with different operation-mode dependent oscillation circuits, e.g., VCLK20 and VCLK30, so that individual circuit blocks can operate under suitable substrate bias control. For example, based on the setting of optimal threshold voltages for individual circuit blocks, a circuit block can operate at a higher speed in exchange for a larger subthreshold leakage current and another circuit block can operate at a smaller subthreshold leakage current in exchange for a lower operation speed.

In regard to the unequality of threshold voltage among transistors as mentioned previously in connection with the embodiment of FIG. 12, it is desirable for this embodiment to divide the main circuit into circuit blocks on a semiconductor chip based on the operation speed so that transistors located close to each other are allotted to a same circuit block.

Although in FIG. 14, the operation mode signal MODE20 is fed commonly to the oscillation circuits VCLK20 and VCLK30, these oscillation circuits may be supplied with different operation mode signals so as to produce different output frequencies. This modified circuit arrangement enables a certain circuit block including a main circuit for a specific logical operation to operate at a higher or lower speed. For example, in case a circuit block LOG30 is a microprocessor having a floating-point arithmetic unit, only this circuit block can be controlled to operate at a higher speed during the floating-point arithmetic process.

Although in this embodiment, the circuit blocks LOG10 and LOG20 are controlled commonly with the oscillation output CLK20 of the operation-mode dependent oscillation circuit VCLK20, these circuit blocks may be controlled by oscillation outputs of different operation-mode dependent oscillation circuits.

Although in the embodiments of FIG. 12 and FIG. 14, the main circuit and its associates are divided into three circuit blocks, they may be divided into a larger number of circuit blocks, and the above-mentioned effectiveness becomes more pronounced as the circuit is divided into much smaller circuit blocks.

The circuit blocks LOG10–LOG30 may be formed on a single LSI chip, or may be formed on multiple LSI chips dividedly. In the latter case, substrate bias control circuits (CNT10, etc.) and corresponding oscillation circuits (OSC10, etc.) are formed on individual semiconductor chips and an operation-mode dependent oscillation circuit is formed commonly for these semiconductor chips, for example. It is desirable to form oscillation circuits (OSC10, etc.), which function to monitor the threshold voltage of main circuits, on the same semiconductor chips of the main circuits so that their threshold voltages are controlled accurately.

Figure 16:
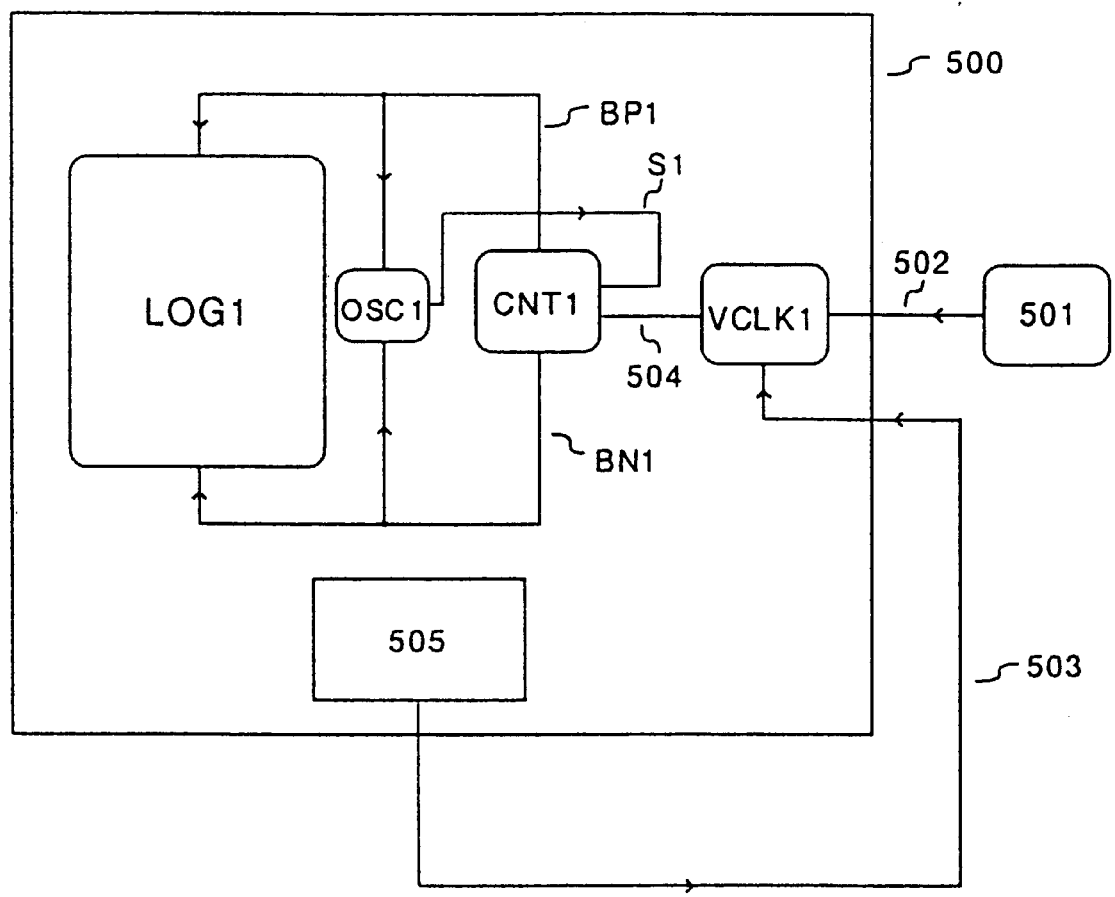
FIG. 16 is a block diagram of the microcomputer based on an embodiment of this invention.

FIG. 16 shows the arrangement of a microcomputer based on an embodiment of this invention. The microcomputer 500, which is formed on a single semiconductor substrate based on the CMOS technology or the like, receives a clock signal 502 from a fixed-frequency crystal oscillator 501 and an operation mode signal 503. The operation mode signal 503 which consists of one bit or more is produced by a load detector 505 within the microcomputer 500. The load detector 505 detects the volume of processing of the microcomputer 500 and produces the operation mode signal 503 which controls the operation speed of the microcomputer 500 to meet the volume of processing.

The load detector 505 may be formed of a semiconductor circuit included in the microcomputer 500, or may be accomplished in the form of a program executed by the microcomputer 500. Alternatively, it may be an external device adapted to monitor the load of the microcomputer 500.

In case the microcomputer 500 runs at a small load, the load detector 505 delivers an operation mode signal of a small value, by which the oscillation circuit VCLK1 is controlled to produce a lower operation clock signal 504 which determines the operation speed and power consumption of the microcomputer 500. If the load of the microcomputer 500 increases, the load detector 505 produces an operation mode signal 503 of a large value, and the microcomputer 500 runs at an increased operation clock frequency to meet the load condition.

In this manner, the microcomputer 500 can run at an optimal operation clock frequency that meets the load condition. The operation mode signal 503 may be an analog signal instead of a multi-bit digital signal.

Figure 17:
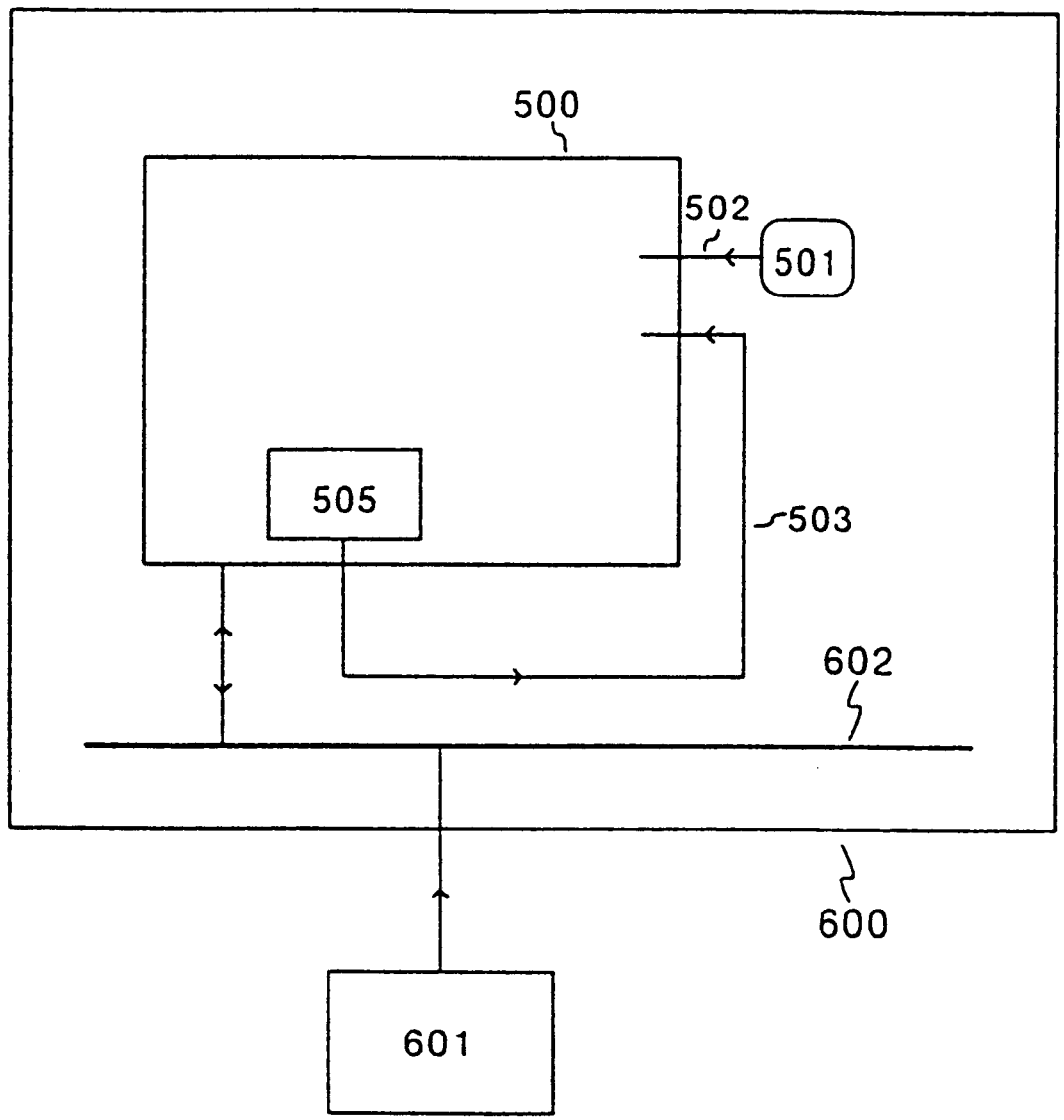
FIG. 17 is a block diagram of the microcomputer system based on an embodiment of this invention.

FIG. 17 shows a microcomputer system based on an embodiment of this invention. The microcomputer system 600 which includes the microcomputer shown in FIG. 16 is connected with an input device 601 such as a keyboard or mouse device through a system bus 602 which is controlled by the microcomputer 500.

A load detector 505 monitors the active time of the input device 601 and produces an operation mode signal 503. During a period of the frequent operation of the input device 601, the operation mode signal 503 specifies such an operation mode that the microcomputer 500 runs at a higher clock frequency, or during the infrequent operation of the input device 601, the microcomputer 500 runs in operation mode of a lower clock frequency.

Generally, the infrequent operation of the input device 601 signifies a small load of the microcomputer 500. Based on this manner of load detection for the microcomputer 500, the power consumption can be reduced without reducing the practical operation speed of the microcomputer system.

Although the microcomputer system of FIG. 17 uses the input device 601 such as a keyboard or mouse device for the estimation of the load of microcomputer, the load condition may be detected in a different manner. For example, the load of the microcomputer may be estimated by measuring the time length of user's CPU access. It is also possible for the system to allow the computer user to set the operation mode through the input device 601.

According to the foregoing embodiments of this invention, the threshold voltage of MOS transistors of the main circuit LOG1 can be controlled by use of the operation mode signal MODE1. For example, for the higher-speed operation of the main circuit, an operation mode in which the operation-mode dependent oscillation circuit VCLK1 produces a higher-frequency output CLK1 is specified from outside so that the threshold voltage of MOS transistors of the main circuit LOG1 is lowered. In this case, the main circuit LOG1 operates fast in exchange for an increased power consumption due to an increased subthreshold current. For the lower-speed operation of the main circuit, an operation mode in which the operation-mode dependent oscillation circuit VCLK1 produces a lower-frequency output CLK1 is specified from outside so that the threshold voltage of MOS transistors of the main circuit LOG1 is raised. In this case, the main circuit LOG1 operates at a reduced power consumption owing to a reduced subthreshold current.

What is claimed is:

1. A semiconductor integrated circuit device comprising:

a first logic circuit including MIS transistors, located on a first area of the semiconductor integrated circuit device;

a second logic circuit including MIS transistors, located on a second area of the semiconductor integrated circuit device;

a first monitoring circuit including MIS transistors which outputs a first oscillation signal;

a second monitoring circuit including MIS transistors which outputs a second oscillation signal;

a first control circuit which receives a first reference clock signal and the first oscillation signal and applies a first substrate bias voltage to MIS transistors of the first logic circuit and the first monitoring circuit according to a first difference between the first reference clock signal and the first oscillation signal; and a second control circuit which receives a second reference clock signal and the second oscillation signal and applies a second substrate bias voltage to MIS transistors of the second logic circuit and the second monitoring circuit according to a second difference between the second reference clock signal and the second oscillation signal;

wherein the first monitoring circuit is located in close proximity to the first area and the second monitoring circuit is located close to the second area, such that the inequality of circuit characteristics of the first logic circuit and the second logic circuit due to a manufacturing process of the semiconductor integrated circuit device is reduced.

2. A semiconductor integrated circuit according to claim 1, wherein a frequency of the first reference clock signal is equal to a frequency of the second reference clock signal.

3. A semiconductor integrated circuit according to claim 1, wherein MIS transistors of said first logic circuit are located close to each other and MIS transistors of said second logic circuit are located close to each other.

4. A semiconductor integrated circuit according to claim 2, wherein MIS transistors of said first logic circuit are located close to each other and MIS transistors of said second logic circuit are located close to each other.

* * * * *